United States Patent
Loh

(10) Patent No.: US 11,475,305 B2
(45) Date of Patent: Oct. 18, 2022

(54) ACTIVATION FUNCTION FUNCTIONAL BLOCK FOR ELECTRONIC DEVICES

(71) Applicant: Advanced Micro Devices, Inc., Santa Clara, CA (US)

(72) Inventor: Gabriel H. Loh, Bellevue, WA (US)

(73) Assignee: Advanced Micro Devices, Inc., Santa Clara, CA (US)

(*) Notice: Subject to any disclaimer, the term of this patent is extended or adjusted under 35 U.S.C. 154(b) by 710 days.

(21) Appl. No.: 15/836,080

(22) Filed: Dec. 8, 2017

(65) Prior Publication Data

US 2019/0180182 A1 Jun. 13, 2019

(51) Int. Cl.
| | |
|---|---|
| *G06N 3/04* | (2006.01) |
| *G06N 3/08* | (2006.01) |
| *G06F 3/0484* | (2022.01) |
| *G06K 9/62* | (2022.01) |
| *G06N 3/06* | (2006.01) |
| *G06F 30/30* | (2020.01) |
| *G06V 10/94* | (2022.01) |

(52) U.S. Cl.
CPC ........... *G06N 3/082* (2013.01); *G06F 3/0484* (2013.01); *G06F 30/30* (2020.01); *G06K 9/6274* (2013.01); *G06N 3/04* (2013.01); *G06N 3/06* (2013.01); *G06V 10/955* (2022.01)

(58) Field of Classification Search
CPC ........ G06F 7/544; G06F 7/546; G06F 1/0307; G06N 3/0481
See application file for complete search history.

(56) References Cited

U.S. PATENT DOCUMENTS

| | | | | |
|---|---|---|---|---|
| 2017/0323196 | A1* | 11/2017 | Gibson | .................... G06N 3/04 |
| 2018/0341495 | A1* | 11/2018 | Culurciello | .............. G06N 3/04 |
| 2019/0042924 | A1* | 2/2019 | Pasca | .................... G06N 3/0481 |
| 2019/0114511 | A1* | 4/2019 | Gao | ........................ G16B 20/00 |
| 2020/0193213 | A1* | 6/2020 | Cao | ........................... G06K 9/36 |

OTHER PUBLICATIONS

Clevert et al, Fast and Accurate Deep Network Learning by Exponential Linear Units (ELUS), 14 pages. (Year: 2016).*
Jouppi, N. et al., In-Datacenter Performance Analysis of a Tensor Processing Unit, 44th International Symposium on Computer Architecture (ISCA), Jun. 2017.

(Continued)

*Primary Examiner* — Chuong D Ngo
(74) *Attorney, Agent, or Firm* — Park, Vaughan, Fleming & Dowler LLP

(57) ABSTRACT

An electronic device has an activation function functional block that implements an activation function. During operation, the activation function functional block receives an input including a plurality of bits representing a numerical value. The activation function functional block then determines a range from among a plurality of ranges into which the input falls, each range including a separate portion of possible numerical values of the input. The activation function functional block next generates a result of a linear function associated with the range. Generating the result includes using a separate linear function that is associated with each range in the plurality of ranges to approximate results of the activation function within that range.

16 Claims, 6 Drawing Sheets

(56) References Cited

OTHER PUBLICATIONS

European Search Report for EU application No. 18885638.9 dated Aug. 9, 2021.
Callejas-Molina, R. et al., Digital Architecture to Implement a Piecewise-Linear Approximation for the Hyperbolic Tangent Function, 2015 International Conference on Computing Systems and Telematics, Oct. 2015.
Amin, H. et al., Piecewise Linear Approximation Applied to Non-linear Function of a Neural Network, IEEE Proceedings: Circuits, Devices, and Systems, vol. 144, No. 6, Dec. 1997.

* cited by examiner

ACTIVATION FUNCTION FUNCTIONAL BLOCK FOR ELECTRONIC DEVICES

BACKGROUND

Related Art

Some electronic devices use neural networks (or "artificial neural networks") to perform corresponding computational operations. Generally, a neural network is a system that includes internal elements with similarities to biological neural networks, such as those in a living creature's brain, which can "learn" or be trained to perform operations. Neural networks are trained to perform the operations by using known information to train and set the internal elements of the neural network so that the neural network can then perform the operation on unknown information. For example, a neural network may be trained to recognize whether digital images include images of faces by using digital images that are known to include images of faces to train the internal structures of the neural network to react appropriately when subsequently analyzing unknown digital images—i.e., to identify digital images that include an image of a face.

A neural network includes a set of artificial neurons, or "nodes," that are interconnected to one another in an arrangement akin to how neurons are interconnected via synapses in a living creature's brain. A neural network can be visualized as a form of directed and weighted graph structure, having input nodes, intermediate nodes, and output nodes, each node other than the output nodes connected with one or more other nodes (or "downstream" nodes) via a directed edge that has an associated weight. As used here, a "directed edge" is a logical or actual interconnection between at least two nodes on which information travels in a specified direction—e.g., from upstream nodes to downstream nodes. The input nodes receive inputs from a source external to the neural network and process the received inputs to produce input values (e.g., numerical values). The input values are then forwarded from the input nodes to downstream intermediate nodes, perhaps being weighted along the way in accordance with a weight of a corresponding directed edge (i.e., adjusted such as by being multiplied by a weighting value, summed with a weighting value, etc.). Within each intermediate node, received values are summed and then processed using an activation function associated with the intermediate node to produce a result value for the intermediate node. The result values are then forwarded from the intermediate nodes to downstream intermediate nodes or output nodes, perhaps being weighted along the way in accordance with a weight of a corresponding directed edge. A neural network often includes a number (and possibly a large number) of layers of intermediate nodes, each layer of intermediate nodes receiving input values and forwarding generated results to intermediate nodes in another layer—or to the output nodes. When the possibly weighted result values are eventually forwarded from the last layer of intermediate nodes to the output nodes, the output nodes process the result values to generate outputs for the neural network. Continuing the image processing example above, the outputs from the output nodes are in a form that indicates whether or not a subject digital image includes an image of a face.

As described above, weights are applied to values forwarded along corresponding edges between nodes in a neural network and intermediate nodes process summed received values using a respective activation function. By tuning/setting the weights associated with the edges so that desired outputs are generated by the neural network, the neural network can be trained to produce intended results—such as properly identifying faces in digital images.

Electronic devices may be able to perform certain operations more easily using neural networks than with other techniques. Neural networks, however, can be computationally intensive and slow to produce results, particularly as the number of layers in the neural network increases. For example, executing an activation function using existing software techniques can require executing/performing multiple sub-operations. When dozens or hundreds of activation functions must be executed for a corresponding number of intermediate nodes, the number of sub-operations can be very large and can require significant time to process.

BRIEF DESCRIPTION OF THE FIGURES

Throughout the figures and the description, like reference numerals refer to the same figure elements.

DETAILED DESCRIPTION

Figure 1:
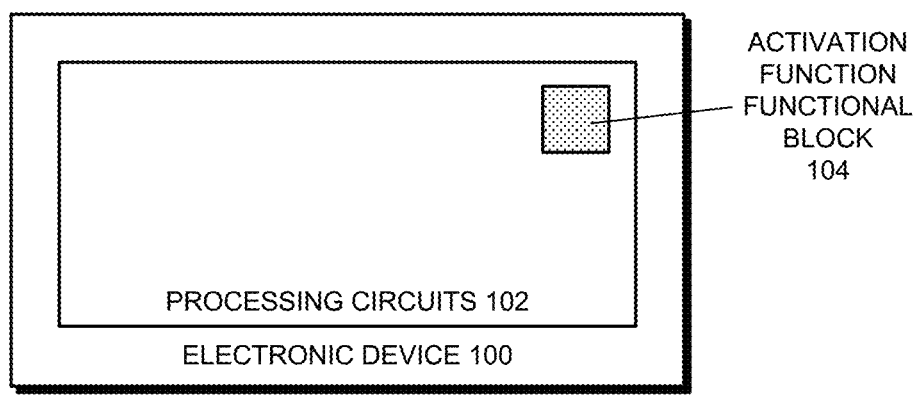
FIG. 1 presents a block diagram illustrating an electronic device in accordance with some embodiments.

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications. Thus, the described embodiments are not limited to the embodiments shown, but are to be accorded the widest scope consistent with the principles and features disclosed herein.

Overview

The described embodiments include an electronic device with processing circuits that perform processing operations. The processing circuits include an activation function functional block with dedicated hardware circuits that implement activation functions such as those used for neural networks and other processing operations. In other words, the activation function functional block includes purpose-specific circuit elements that generate results for activation functions based on received inputs. In the described embodiments, the hardware circuits in the activation function functional block are configured to approximate results for activation functions over two or more ranges of numerical values based on corresponding linear functions. The hardware circuits are therefore configured so that, for each of a number of separate ranges of numerical values, given an input in the range, the hardware circuits generate results of a linear function associated with that range—with the results being the approximations of the results of activation function in that range.

The activation functions implemented in the hardware circuits can include any activation function for which results can be approximated using linear functions. For example, a rectified linear unit (ReLU) activation function may be implemented in the hardware circuits (and other activation functions are described in more detail below). In the case of the ReLU activation function, the above-described ranges include two ranges that correspond with ranges for which the ReLU activation function returns similar types of results. More specifically, the two ranges include a first range for 0 and all positive input values, and a second range that includes negative input values. For the first range, the hardware circuits generate a result that is equal to the input value, which is the linear function y=x, and for the second range, the hardware circuits generate a result of 0, which is the constant linear function y=0. The hardware circuits therefore, given an input of 3, generate a result of 3, and given an input of −2, generate a result of 0.

In the described embodiments, the hardware circuits include circuit elements that cause the hardware circuits to generate results associated with the appropriate range for a given input. In other words, the circuit elements are responsible for determining the range into which the given input value falls and causing the hardware circuits to generate results for that range. In some embodiments, the circuit elements determine the range based on only a subset of bits within the input (i.e., some combination of bits of the input that includes less than all of the bits of the input). For example, the hardware circuits may use only a sign bit from the input to determine if an input value is a negative number or a positive number (for simplicity, zero is assumed to be positive in this description). As another example, sign bit and some or all of an integer portion of an input having an integer and fractional portion representing a numerical value may be used to determine if the input value is between −1 and 1.

By implementing activation functions in hardware, the described embodiments significantly improve the speed of evaluating activation functions over existing techniques, particularly those in which general purpose processing circuits are used to compute results for activation functions. By using linear functions to approximate the results of the activation functions in corresponding ranges of input values, the hardware circuits are simpler. By using only the subset of the bits to determine an appropriate range, the hardware circuits need only process a small number of bits, instead of performing more complex comparison operations. In sum, by using the hardware circuits described herein to implement activation functions, operations that depend on activation functions, such as neural network processing and other operations, can be performed faster, for less electrical power, and with less area and complexity in processing circuits, which improves the design, fabrication, and operation of the processing circuits and electronic devices in which the processing circuits are used.

Electronic Device

FIG. 1 presents a block diagram illustrating an electronic device 100 in accordance with some embodiments. As can be seen in FIG. 1, electronic device 100 includes processing circuits 102. Processing circuits 102 include one or more electronic circuits (e.g., integrated circuits, discrete circuit elements, etc.) that are configured to perform processing operations, such as a processor core or processing pipeline in a microprocessor, a compute unit in a general purpose graphics processing unit (GPGPU), processing circuits in an application specific integrated circuit (ASIC), etc. Generally, processing circuits 102 are implemented in hardware, i.e., using various circuit elements and devices. For example, some or all of the subsystems can be entirely fabricated on one or more semiconductor chips, can be fashioned from semiconductor chips in combination with discrete circuit elements, can be fabricated from discrete circuit elements alone, etc.

Processing circuits 102 include activation function functional block 104. Activation function functional block 104 is a functional block that performs operations for evaluating activation functions. In other words, activation function functional block 104 includes hardware circuits, such as integrated circuits and/or discrete circuit elements, that will generate a result of an activation function based on an input value. Activation functions that may be implemented in activation function functional block 104, such as the rectified linear unit (ReLU), leaky ReLU, etc., are described in more detail below.

In some embodiments, processing circuits 102 and activation function functional block 104 are used at least in part for performing operations for neural networks. In these embodiments, general purpose or dedicated processing circuits in processing circuits 102 execute instructions or perform other processing operations for the nodes in the neural network. These operations include processing operations for the various nodes, weighting and/or summing result values, and handling information/value flow through the neural network. In addition, activation function functional block 104 performs the operations herein described for generating result values of activation functions for intermediate nodes. In other words, some of the operations of a given neural network are performed by processing circuits 102, but processing circuits 102 rely on activation function functional block 104 for evaluating particular activation functions. For example, in some embodiments, processing circuits 102 include an execution pipeline in which various program code instructions for the neural network (i.e., that implement the neural network) are executed, with the purpose-specific circuits in activation function functional block 104 being used within the pipeline to generate results of corresponding activation functions. In some of these embodiments, activation function functional block 104 is included in an execution stage of the pipeline, such as in an arithmetic logic unit (ALU), an integer or floating point execution unit, etc. As another example, in some embodiments, processing circuits 102 include a GPGPU compute unit in which various program code instructions for the neural network are executed, with the purpose-specific circuits in activation function functional block 104 being used within the compute unit or by the compute unit to generate results of corresponding activation functions.

Although an example of a neural network is used herein for describing the operations of activation function functional block 104, in some embodiments, processing circuits 102 and/or activation function functional block 104 are used for performing computational operations other than for a neural network. Generally, any time that an activation function can be used to generate results that are useful for a given computational operation, activation function functional block 104 can be used by processing circuits 102 for generating the result.

Although electronic device 100 is simplified for illustrative purposes, in some embodiments, electronic device 100 includes additional or different subsystems, functional blocks, elements, and/or communication paths. For example, electronic device 100 may include display subsystems, power subsystems, I/O subsystems, etc. Generally, electronic device 100 includes sufficient subsystems to perform the operations herein described.

Electronic device 100 can be, or can be included in, any device that performs computational operations. For example, electronic device 100 can be, or can be included in, a desktop computer, a laptop computer, a wearable computing device, a tablet computer, a piece of virtual or augmented reality equipment, a smart phone, an artificial intelligence (AI) device, a server, a network appliance, a toy, a piece of audio-visual equipment, a home appliance, a vehicle, etc., and/or combinations thereof.

Rectified Linear Unit Activation Function

Figure 2:
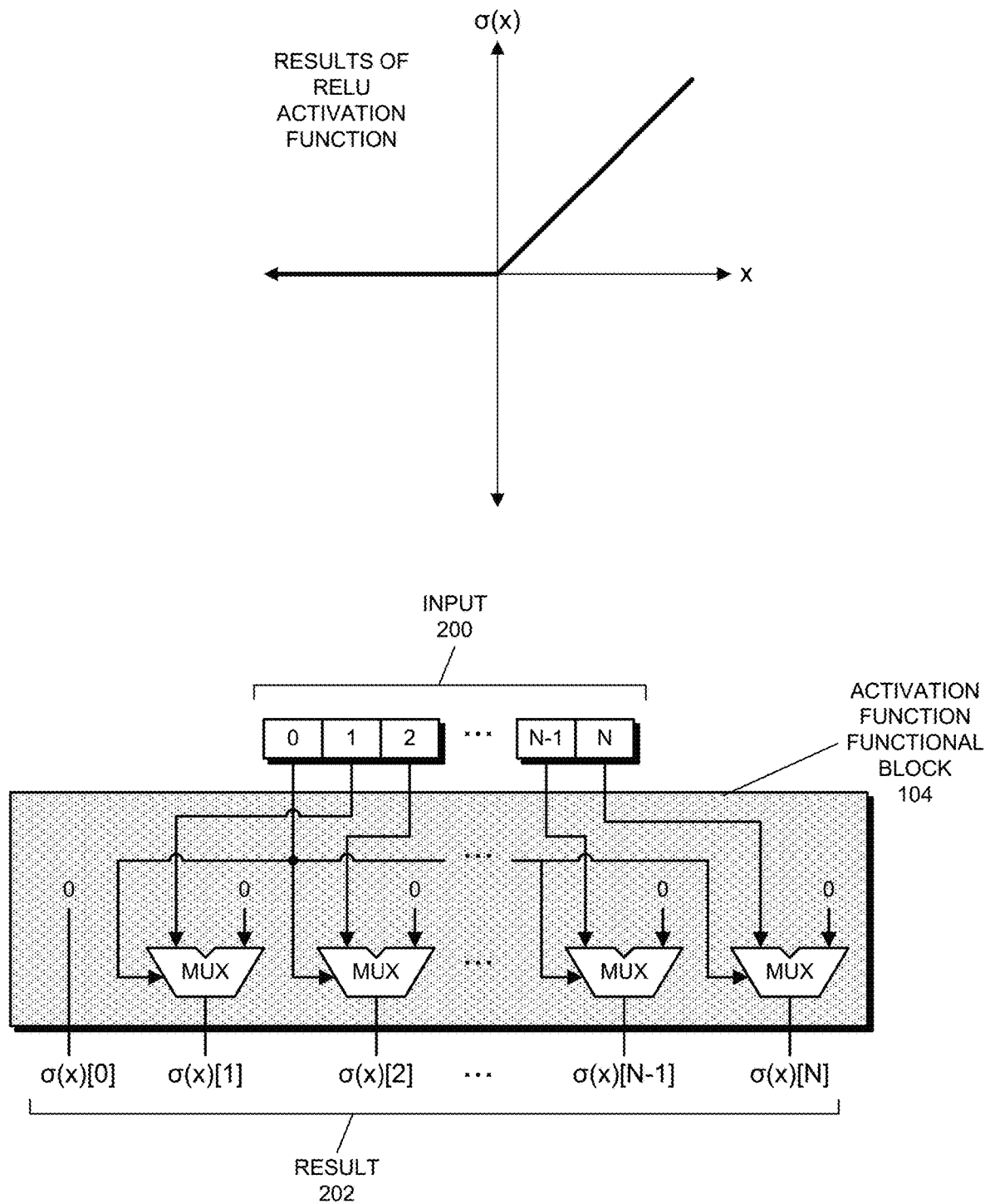
FIG. 2 presents a graph of results of a rectified linear unit (ReLU) activation function and a hardware circuit implementation of an approximation of the ReLU activation function in accordance with some embodiments.

In some embodiments, activation function functional block 104 includes circuit elements for implementing a rectified linear unit (ReLU) activation function. FIG. 2 presents a graph of results of a ReLU activation function and a hardware circuit implementation of an approximation of the ReLU activation function in accordance with some embodiments. Note that the hardware circuits shown in FIG. 2 are presented as a general example of hardware circuits for some embodiments. The hardware circuits in other embodiments include different circuit elements and/or arrangements of circuit elements. For example, instead of using multiplexers ("MUXes"), some embodiments use logic gates such as AND gates, XOR gates, transmission gates, dynamic logic, and/or complex/custom logic.

Figure 3:
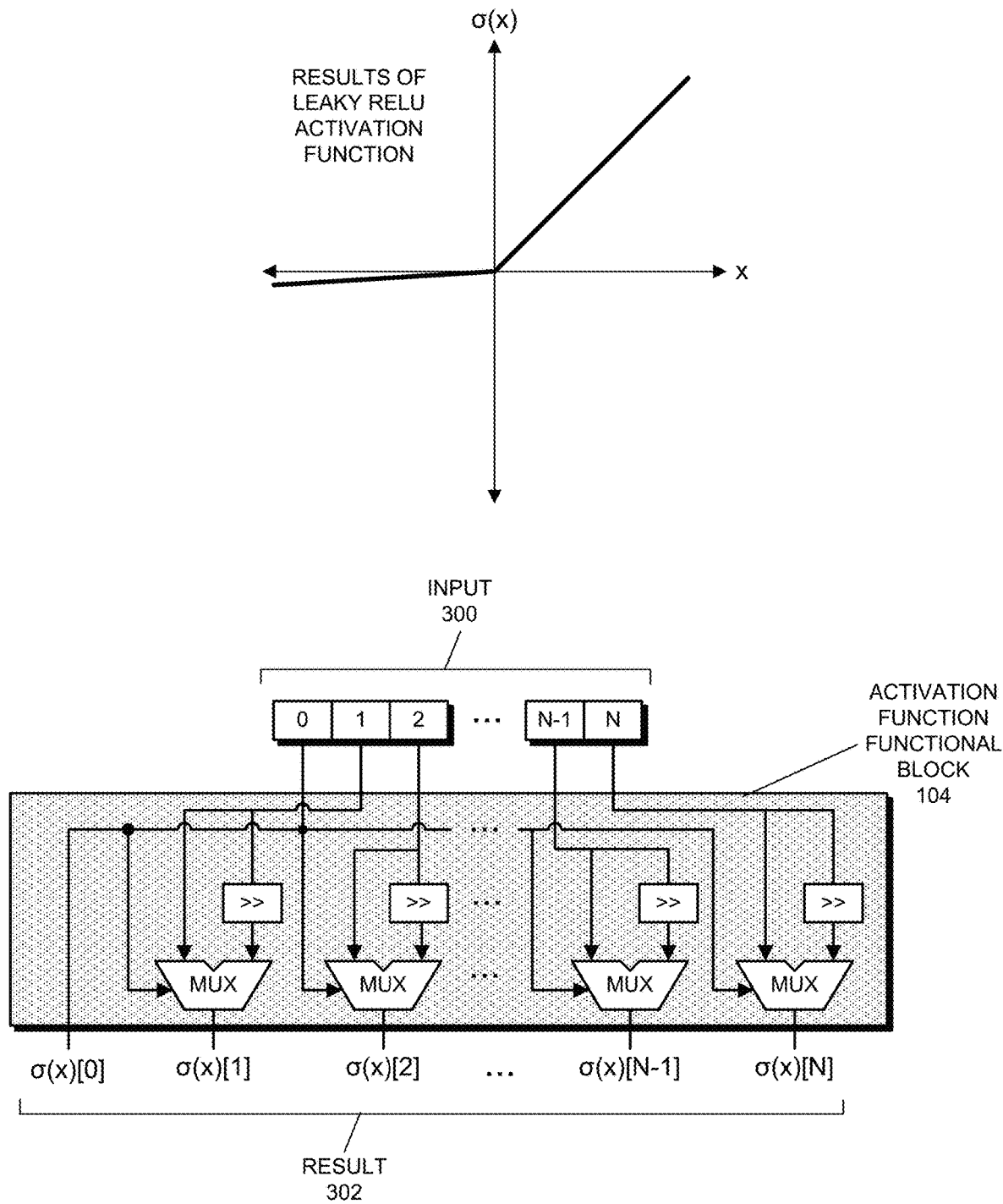
FIG. 3 presents a graph of results of a leaky ReLU activation function and a hardware circuit implementation of an approximation of the leaky ReLU activation function in accordance with some embodiments.
Figure 4:
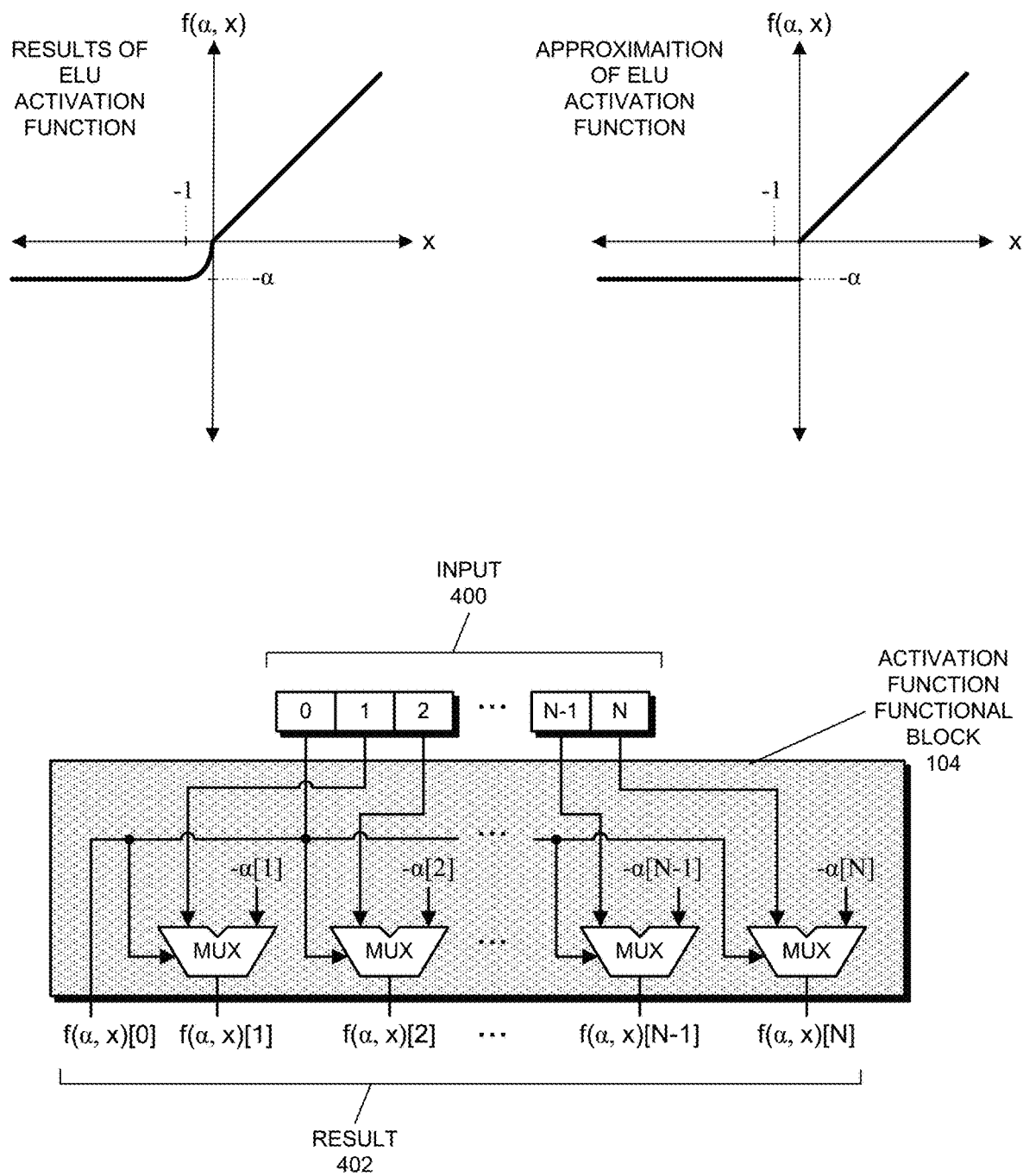
FIG. 4 presents a graph of results of an exponential linear unit (ELU) activation function, an approximation of the ELU activation function, and a hardware circuit implementation of the approximation of ELU activation function in accordance with some embodiments.
Figure 5:
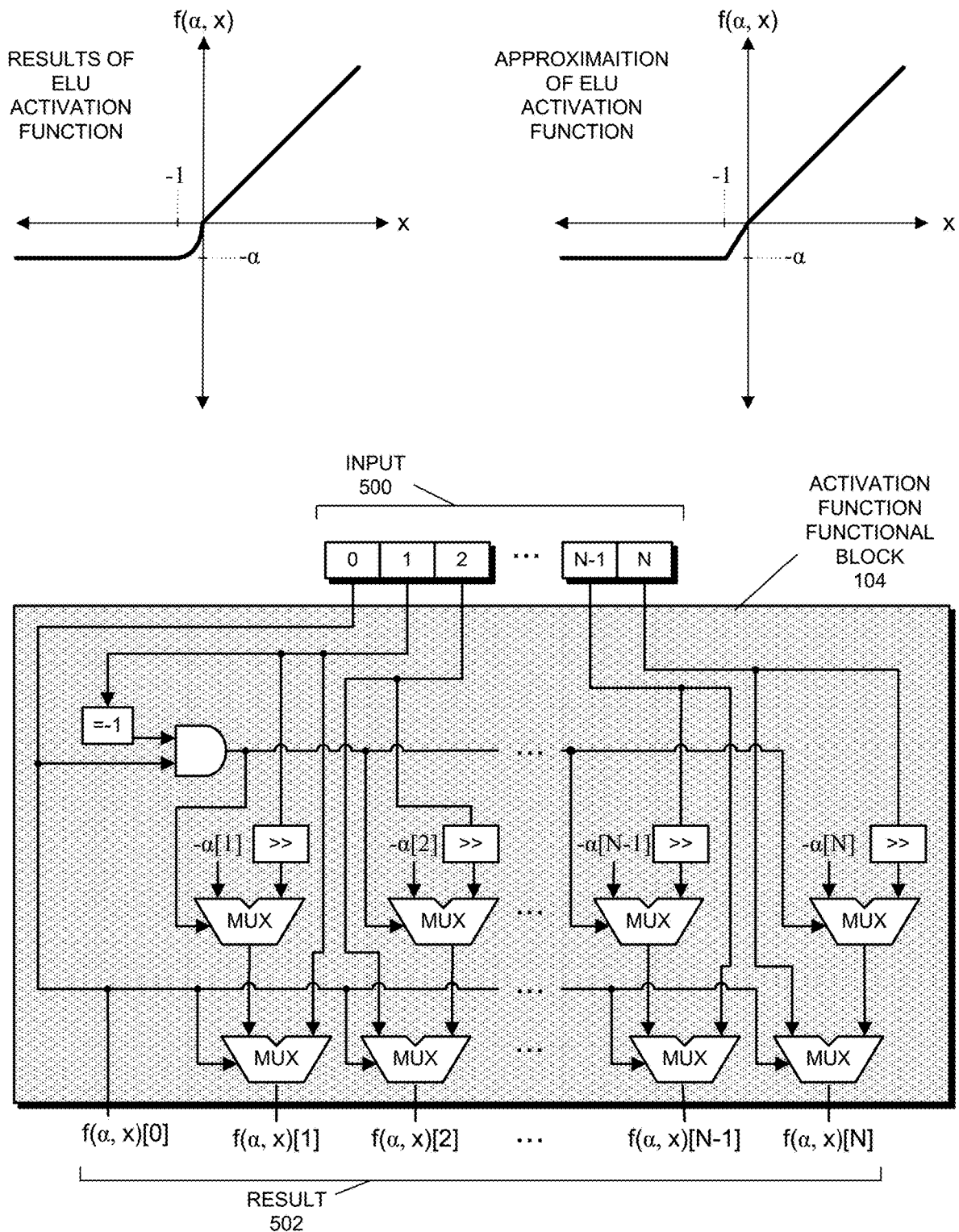
FIG. 5 presents a graph of results of an ELU activation function, an approximation of the ELU activation function, and a hardware circuit implementation of the approximation of ELU activation function in accordance with some embodiments.

For the embodiment shown in FIG. 2 and the embodiments in FIGS. 3-5, a format for an input (i.e., input 200 in FIG. 2, input 300 in FIG. 3, etc.) is assumed in which bit [0] is a sign bit and bits [1]-[N] express the numerical value. In other embodiments, other numerical formats are used, such as a format with the sign bit in a different location, e.g., bit [N]. Depending on the type of input, bits [1]-[N] may include or be interpreted as a simple numerical value (e.g., as an integer), a mantissa/significand and exponent information (e.g., as a floating point value), etc. As shown by the ellipses in FIGS. 2-5, the input can have any number of bits, e.g., 64, 250, etc., and a corresponding arrangement of hardware circuits is used for processing input 200/generating result 202.

As can be seen in the graph of the results of the ReLU activation function in FIG. 2, the function returns, as σ(x), a result of 0 for all input values x below 0, i.e., for a first range that includes all negative values of x, and returns a result of x for all input values x at and above 0, i.e., for a second range that includes all positive values of x (throughout this description, 0 is assumed to be a positive value of x). The hardware circuits in activation function functional block 104 are configured to approximate the input/result behavior of ReLU by generating a zero 0 for the first range of negative input values x and generating a value of x for the second range of positive input values x.

Note that the "approximation" for some of the examples herein, e.g., FIGS. 2-3, is exactly the value of the "approximated" activation function, but is described as an approximation simply for consistency with other examples, e.g., FIGS. 4-5, that include at least some actual approximation. In other words, the approximation of ReLU by the hardware circuits in FIG. 2-3 is precise, whereas the hardware circuits in other examples are less precise. Note that the approximations in the other examples are functionally correct and sufficient, particularly given the trainable nature of neural networks, i.e., given the fact that weights for directed edges of the neural network can be adjusted during training to account for any minor imprecision in the approximations. Also, although graphs of the approximation are shown in FIGS. 4-5, only the graphs of the results are shown in FIGS. 2-3, as the approximations in FIGS. 2-3 appear the same as the results.

As can be seen in the hardware circuits, the sign bit, i.e., bit [0] of input 200, is forwarded to a select input of a series of multiplexers ("MUX"). Each multiplexer has a different single bit of input 200 as one input and a constant 0 as another input. For example, a first (leftmost in FIG. 2) multiplexer has bit [1] of input 200 as one input and the constant 0 as the other input. When the numerical value of input 200 is negative, the sign bit is (assumed for the examples herein to be) a 1, which causes, via the select input, each of the multiplexers to forward the constant 0 to a respective bit of result 202. When the numerical value of input 200 is positive, the sign bit is a 0, which causes, via the select input, each of the multiplexers to forward the value of the corresponding single bit of input 200 to a respective bit of result 202. In addition, the first/leftmost bit of the result is set to a constant value of zero. By operating as described, the behavior of ReLU is approximated by the hardware circuits, with the sign bit functioning to select the result 202 generated by the hardware circuits, i.e., to "determine" the range from among the two possible ranges for the ReLU activation function into which input 200 falls.

Leaky Rectified Linear Unit Activation Function

In some embodiments, activation function functional block 104 includes circuit elements for implementing a leaky rectified linear unit (leaky ReLU) activation function. FIG. 3 presents a graph of results of a leaky ReLU activation function and a hardware circuit implementation of an approximation of the leaky ReLU activation function in accordance with some embodiments. Note that the hardware circuits shown in FIG. 3 are presented as a general example of hardware circuits for some embodiments. The hardware circuits in other embodiments include different circuit elements and/or arrangements of circuit elements. For example, instead of using multiplexers ("MUXes"), some embodiments use logic gates such as AND gates, XOR gates, transmission gates, dynamic logic, and/or complex/custom logic.

As can be seen in the graph of the results of the leaky ReLU activation function in FIG. 3, the function returns, as σ(x), a result of a fractional value of x (e.g., x/16) for all input values x below 0, i.e., for a first range that includes all negative values of x, and returns a result of x for all input values x at and above 0, i.e., for a second range that includes all positive values of x. The hardware circuits in activation function functional block 104 are configured to approximate the input/result behavior of leaky ReLU by generating a fractional value of x for the first range of negative input values x and generating a value of x for the second range of positive input values x.

For the example in FIG. 3, a shifted version of input 300, which is the above-described "fractional" value of the input, is generated in order to be used as an input for the multiplexers. For example, input 300 may be shifted by four bit positions, with a corresponding adjustment to account for the negative value of input 300, to essentially divide input 300 by 16. The values of the individual bits following the shift operation are what is shown in FIG. 3 using a box for each separate bit that is marked with ">>." Although a particular shifting circuit element is not shown in FIG. 3, in some embodiments, the shift operation is performed for all of the bits of input 300 as a group in such a shifting circuit element, and the shifted bits are forwarded to the multiplexers as shown.

As can be seen in the hardware circuits, the sign bit, i.e., bit [0] of input 300, is forwarded to a select input of a series of multiplexers ("MUX"). Each multiplexer has a different single bit of input 300 as one input and a value of the single bit of input 300 after the shift operation has been performed as another input. For example, a first (leftmost in FIG. 3) multiplexer has bit [1] of input 300 as one input and bit [1] of input 300 after the shifting operation as the other input. When the numerical value of input 300 is negative, the sign bit is a 1, which causes, via the select input, each of the multiplexers to forward the value of the single bit of input 300 after the shift operation has been performed to a respective bit of result 302. When the numerical value of input 300 is positive, the sign bit is a 0, which causes, via the select input, each of the multiplexers to forward the value of the corresponding single bit of input 300 to a respective bit of result 302. In addition, the first/leftmost bit of the result 302 is set to a constant value of zero. By operating as described, the behavior of leaky ReLU is approximated by the hardware circuits, with the sign bit functioning to select the result 302 generated by the hardware circuits, i.e., to "determine" the range from among the two possible ranges for the leaky ReLU activation function into which input 300 falls.

In some embodiments, the fractional value of the input can be adjusted during operation, i.e., as activation function functional block 104 operates during and after a startup operation. For example, activation function functional block 104 may be operating using an x/16 fractional value, but may be adjusted to use an x/8 or x/32 fractional value. In these embodiments, the above-described shift operation can be adjusted so that a different amount of shift is performed on the input value to generate a corresponding fractional value, e.g., a shift of three bit positions for x/8 or five bit positions for x/32. In some embodiments, the amount of the shift can be provided to activation function functional block 104 by an external source, such as a software application or operating system executing on electronic device 100, a programmer, user, or system administrator, etc. For example, a value can be written to a register, flag, or memory location, the value used by the shifting circuit element to determine an amount of shift—and thus the fractional value of x.

Exponential Linear Unit Activation Function—First Embodiment

In some embodiments, activation function functional block 104 includes circuit elements for implementing an exponential linear unit (ELU) activation function. FIG. 4 presents a graph of results of an ELU activation function, an approximation of the ELU activation function, and a hardware circuit implementation of the approximation of ELU activation function in accordance with some embodiments. Note that the hardware circuits shown in FIG. 4 are presented as a general example of hardware circuits for some embodiments. The hardware circuits in other embodiments include different circuit elements and/or arrangements of circuit elements. For example, instead of using multiplexers ("MUXes"), some embodiments use logic gates such as AND gates, XOR gates, transmission gates, dynamic logic, and/or complex/custom logic.

As can be seen in the graph of the results of the ELU activation function in FIG. 4, the function returns, as $f(\alpha, x)$, a result that, starting from 0 and proceeding downward in negative values, exponentially approaches $-\alpha$ as $\alpha(e^x-1)$, i.e., for a first range that includes all negative values of x, and returns a result of x for all input values x at and above 0, i.e., for a second range that includes all positive values of x. As can be seen in the graph of the approximation of the ELU activation function in FIG. 4, in the second range of positive values, the approximation returns, as $f(\alpha, x)$, a value of x for each input value x. For the first range of negative values, however, the approximation ignores the exponential curve and returns a constant value of $-\alpha$ for all input values. The hardware circuits in activation function functional block 104 are configured to approximate the input/result behavior of the ELU activation function, as shown in the rightmost graph, by generating $-\alpha$ for the first range of negative input values x and generating a value of x for the second range of positive input values x.

As can be seen in FIG. 4, the approximation of the result of the ELU activation function is imprecise—and incorrect—for at least some of the negative values, which is particularly noticeable in the initial portion of the result curve for the ELU activation function between 0 and -1. Although imprecise, the approximation is functionally correct and sufficient, particularly given the trainable nature of neural networks. In other words, the small difference between the results of the ELU activation function and the approximation can be compensated for during training of neural networks using adjustments to a and/or to weights for corresponding directed edges. By avoiding the need for computing the precise result of the exponential function as described, these embodiments significantly reduce the effort required to evaluate the ELU activation function (in terms of circuit complexity and area, time, electrical power consumed, etc.).

As can be seen in the hardware circuits, the sign bit, i.e., bit [0] of input 400, is forwarded to a select input of a number of multiplexers ("MUX"). Each multiplexer has a different single bit of input 400 as one input and a corresponding bit of the constant $-\alpha$ as another input. For example, a first (leftmost in FIG. 4) multiplexer has bit [1] of input 400 as one input and the corresponding bit of the constant $-\alpha$ as the other input. When the numerical value of input 400 is negative, the sign bit is a 1, which causes, via the select input, each of the multiplexers to forward the constant $-\alpha$ to a respective bit of result 402. When the numerical value of input 400 is positive, the sign bit is a 0, which causes, via the select input, each of the multiplexers to forward the value of the corresponding single bit of input 400 to a respective bit of result 402. In addition, the first/leftmost bit of the result is set equal to the sign bit of input 400. By operating as described, the behavior of ELU is approximated by the hardware circuits, with the sign bit functioning to select the result 402 generated by the hardware circuits, i.e., to "determine" the range from among the two possible ranges for the ELU activation function into which input 400 falls.

Exponential Linear Unit Activation Function—Second Embodiment

As described above, in some embodiments, activation function functional block 104 includes circuit elements for implementing an ELU activation function. FIG. 5 presents a graph of results of an ELU activation function, an approximation of the ELU activation function, and a hardware circuit implementation of the approximation of ELU activation function in accordance with some embodiments. Note that the hardware circuits shown in FIG. 5 are presented as a general example of hardware circuits for some embodiments. The hardware circuits in other embodiments include different circuit elements and/or arrangements of circuit elements. For example, instead of using multiplexers ("MUXes"), some embodiments use logic gates such as AND gates, XOR gates, transmission gates, dynamic logic, and/or complex/custom logic.

Recall that FIG. 4, similarly to FIG. 5, presents an embodiment of activation function functional block 104 with circuit elements for implementing the ELU activation function. The difference between FIGS. 4 and 5 is in the particular approximation of the ELU activation function. As described below, in contrast to the two ranges used in FIG. 4, the approximation shown in FIG. 5 includes a third range, in which a portion of the ELU function is approximated using a separate linear function. The hardware circuit for FIG. 5 is therefore somewhat more complex, but the result generated by activation function functional block 104 more precisely—although not perfectly—replicates the results of the ELU activation function.

As can be seen in the graph of the results of the ELU activation function in FIG. 5, the function returns, as $f(\alpha, x)$, a result that, starting from 0 and proceeding downward in negative values, exponentially approaches $-\alpha$ as $\alpha(e^x-1)$, i.e., for a first range that includes all negative values of x, and returns a result of x for all input values x at and above 0, i.e., for a second range that includes all positive values of x. As can be seen in the graph of the approximation of the ELU activation function in FIG. 5, in the second range of positive values, the approximation returns, as $f(\alpha, x)$, a value of x for each input value x. For the first range of negative values, however, the approximation disregards the exponential curve and returns two different types of results over the negative values. For input values between 0 and −1, including −1, the approximation returns, as $f(\alpha, x)$, a value of $\alpha x$ for each input value x, which can be observed in the steeper slope of the approximation between 0 and −1. For input values less than −1, the approximation returns, as $f(\alpha, x)$, a constant value of $-\alpha$ for all input values. The hardware circuits in activation function functional block 104 are configured to approximate the input/result behavior of ELU by generating $\alpha x$ for input values between 0 and −1 in the first range of negative input values, generating $-\alpha$ for input values lower than −1 in the first range of negative input values, and generating a value of x for the second range of 0 and positive input values x.

As can be seen in FIG. 5, the approximation of the result of the ELU activation function is imprecise—and incorrect—for at least some of the negative values, which is particularly noticeable in the initial portion of the result curve for the ELU activation function between 0 and −1. Although imprecise, the approximation is functionally correct and sufficient, particularly given the trainable nature of neural networks. In other words, the small difference between the results of the ELU activation function and the approximation can be compensated for during training of neural networks using adjustments to a and/or to weights for corresponding directed edges. By avoiding the need for computing the precise result of the exponential function as described, these embodiments significantly reduce the effort required to evaluate the ELU activation function (in terms of circuit complexity and area, time, electrical power consumed, etc.).

For the example in FIG. 5, a shifted version of input 500, which functions as the above-described value of $\alpha x$ for input value x of the input, is generated in order to be used as an input for certain multiplexers. For example, assuming that a is equal to 2, as is done for the example in FIG. 5, input 500 may be shifted by one bit position, with a corresponding adjustment to account for the negative value of input 500, to essentially multiply input 500 by 2. The values of the individual bits following the shift operation are what is shown in FIG. 5 using a box for each separate bit that is marked with ">>." Although a particular shifting circuit element is not shown in FIG. 5, in some embodiments, the shift operation is performed for all of the bits of input 500 as a group in such a shifting circuit element, and the shifted bits are forwarded to the multiplexers as shown.

The hardware circuits shown in FIG. 5 are now described. For this description, the uppermost row of multiplexers as shown in FIG. 5 is called a "first row," and the lowermost row of multiplexers is called a "second row." As can be seen in the hardware circuits, bit [1] of input 500 is forwarded to a comparison circuit (shown in FIG. 5 using a box that is marked with "=−1") that asserts (e.g., sets to 1) an output when bit [1] of input 500 indicates that input 500 is equal to 1. Here it is assumed that negative numbers are rounded down, so that a value of −1 means that the actual numerical value of input 500 is something between 0 and −1—i.e., is a decimal negative number that is greater than −1. Note that a particular bit, bit [1], of input 500 is described as being used to determine, in the comparison circuit, whether input 500 can be equal to 1. In some embodiments, however, different arrangements of bit(s) are used for making this determination. Generally, these embodiments check an integer portion of input 500 to determine whether the integer portion equals 1 (and not, say 21, 5, or another value) and assert the result when this is found to be the case.

A result output by the comparison circuit serves as one input for an AND gate, with the other input of the AND gate being the sign bit, i.e., bit [0] of input 500. Recall that the sign bit is 1 when input 500 is negative, so that, when combined with the check performed by the comparison circuit, the result output by the AND gate indicates whether or not input 500 is a negative value between −1 and 0.

The result output by the AND gate is forwarded to a select input of the first row of multiplexers ("MUX"). Each multiplexer in the first row has a different corresponding bit of the constant $-\alpha$ as one input and a value of a single bit of input 500 after the shift operation has been performed as another input. For example, a first (leftmost in FIG. 5) multiplexer in the first row has the corresponding bit of the constant $-\alpha$ as one input and bit [1] of input 500 after the shifting operation as the other input. When the result output by the AND gate is a 1 (i.e., input 500 is a negative value between 0 and −1), it causes, via the select input, each of the multiplexers in the first row to forward the value of the single bit of input 500 after the shift operation has been performed to one input of a corresponding multiplexer in the second row. When the result output by the AND gate is 0 (i.e., input 500 is a negative value lower than −1), it causes, via the select input, each of the multiplexers in the first row to forward the value of the corresponding bit of the constant $-\alpha$ to the one input of the corresponding multiplexer in the second row.

The multiplexers in the second row receive, as a select input, the sign bit of input 500. Each multiplexer in the second row has a different single bit of input 500 as one input and an output of a corresponding multiplexer in the first row as another input. For example, a first (leftmost in FIG. 5) multiplexer in the second row has bit [1] of input 500 as one input and the output of the first/leftmost multiplexer in the first row as the other input. When the numerical value of input 500 is negative, the sign bit is a 1, which causes, via the select input, each of the multiplexers to forward the value of the output of the corresponding multiplexer in the first row to a respective bit of result 502. When the numerical value of input 500 is positive, the sign bit is a 0, which causes, via the select input, each of the multiplexers to forward the value of the corresponding single bit of input 500 to a respective bit of result 502. In addition, the first/leftmost bit of the result is set equal to the sign bit of input 400. By operating as described, the behavior of ELU is approximated by the hardware circuits, with the sign bit and the integer portion of input 500 functioning to select the result 502 generated by the hardware circuits, i.e., to "determine" the range from among the three possible ranges for the ELU activation function into which input 500 falls.

Other Activation Functions

The above-described activation functions, i.e., ReLU, leaky ReLU, and ELU, are but three of numerous activation functions that might be implemented in activation function functional block 104. Generally, any activation function that can be approximated using two or more linear functions in corresponding ranges can be implemented in the described embodiments. Some examples of other activation functions include the hyperbolic tangent ("tanh") activation function, the soft-step/logistic activation function, the binary step activation function, the soft-sign activation function, and others. In some embodiments, derivatives of activation functions such as ReLU and others may be implemented in activation function functional block 104. In some embodiments, various circuit elements used for generating result values, akin to the above-described shifts, can be used for implementing the approximation of each activation function in activation function functional block 104.

As shown in the various figures, implementing a particular number of ranges includes adding circuit elements such as multiplexers, AND gates, etc. so that a result of an activation function is output from activation function functional block 104 when the input is in a corresponding range. For example, for every range beyond two, another layer of multiplexers may be added with corresponding select inputs (some of which may be relatively complex when compared to the select inputs shown in FIGS. 2-5).

Generating a Result of an Activation Function

Figure 6:
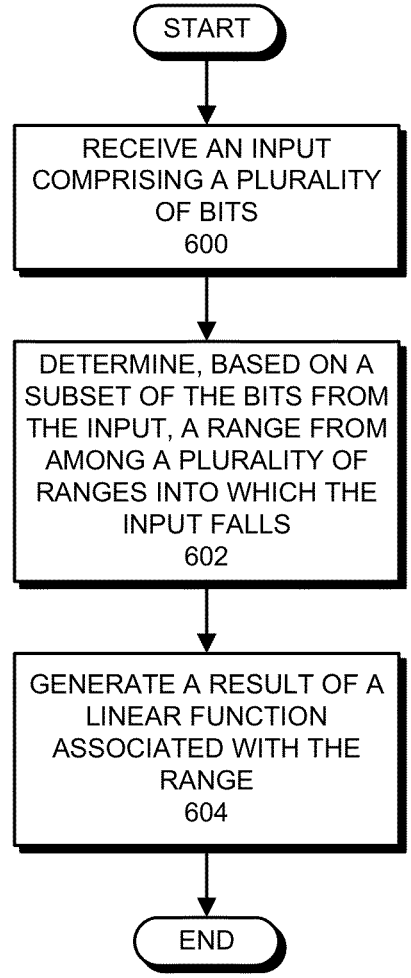
FIG. 6 presents a flowchart illustrating a process for generating results of an activation function in accordance with some embodiments.

The described embodiments perform operations for generating the results of activation functions using corresponding hardware circuits in an activation function functional block (e.g., activation function functional block 104). FIG. 6 presents a flowchart illustrating a process for generating the results of an activation function in accordance with some embodiments. Note that the operations shown in FIG. 6 are presented as a general example of functions performed by some embodiments. The operations performed by other embodiments include different operations and/or operations that are performed in a different order. Additionally, although certain mechanisms are used in describing the process (e.g., activation function functional block 104, etc.), in some embodiments, other mechanisms can perform the operations.

In describing FIG. 6, the ReLU activation function is used as the activation function implemented in the activation function functional block—with hardware circuits as shown in FIG. 2. In addition, it is assumed that the activation function functional block is being used to perform operations for a node in a neural network. In other words, the activation function functional block, which is a general purpose functional block that can be used to evaluate the ReLU function for any purpose, is being used to evaluate the ReLU function for a given node in the neural network. Although the ReLU function is described for FIG. 6, other embodiments use other activation functions and/or other arrangements of hardware circuits.

In addition, in describing FIG. 6, an input including a plurality of bits representing a numerical value such as a signed integer value, a floating point value, etc. that includes, in corresponding portions, a sign bit and a number of bits representing the numerical value is described as being received by the activation function functional block. Depending on the configuration of the neural network, i.e., how many earlier/upstream nodes are connected to the node for which the activation function is being evaluated, the input received by the activation function functional block may be a sum of two or more weighted outputs from an earlier/upstream node in the neural network or may be a weighted output from a single earlier/upstream node in the neural network. For example, the input received in step 600 may be a weighted output of an input node for the neural network, a weighted result of an activation function for an earlier intermediate node in the neural network, or a sum of weighted outputs and/or weighted results from earlier nodes in the neural network.

The process shown in FIG. 6 starts when the activation function functional block receives an input including a plurality of bits (step 600). As described above, during this operation, the activation function functional block receives an input including a plurality of bits representing a numerical value that has a sign bit and a number of bits representing a numerical value.

The hardware circuits in the activation function functional block then determine, based on a subset of the bits from the input, a range from among a plurality of ranges into which the input falls (step 602). During this operation, the hardware circuits, for the ReLU activation function, determine whether the input has a negative value (i.e., any value below 0) or a positive value (i.e., any value, 0 or above, including 0). In order to make this "determination," the hardware circuits forward the sign bit from the input to the select inputs of the multiplexers in the hardware circuits (see FIG. 2). The select input, as described above, will cause each multiplexer to select one of two inputs of the multiplexer to be forwarded to an output, thereby choosing a range into which the input falls. In other words, the hardware circuits will generate a result based on a range into which the value of the input falls.

Note that "determine" as used here is a generic term, and does not imply a separate determining operation or a particular result therefrom. Instead, "determine" is used to describe how the hardware circuits handle the processing of the input given corresponding ranges so that a desired result is generated by the activation function functional block.

Note also that only a subset of the bits is used in the determining operation. Specifically, the sign bit, which is a single bit, is the only bit used in the determining operation. Because the described embodiments are able to determine a range into which the input falls and produce a corresponding result using only one bit of the input, the hardware circuits in the activation function functional block can be simpler than circuits that perform other comparison operations (greater than, less than, greater than or equal to, etc.), which means that the activation function functional block can require less electrical power, have lower design complexity, take up less space on a semiconductor layout or circuit mount, etc.

The hardware circuits then generate a result of a linear function associated with the range (step 604). For this operation, the hardware circuits produce, on the output of each multiplexer, the value of an input that is selected by the select input. For the ReLU function, for each multiplexer, the output is one of the value of a corresponding bit of the input or a constant value of 0, depending on whether the range into which the input falls is negative or positive. For example, if the input is a positive value and the value of the corresponding bit of the input to a particular one of the multiplexers is a 1 (i.e., in the range of positive values), the output of that particular multiplexer will be 1. On the other hand, if the input is a negative value, the output of that particular multiplexer will be the constant 0. The result output by the activation function functional block can then be forwarded, possibly after being weighted, to a downstream node in the neural network such as a subsequent intermediate node or an output node for processing thereby.

In some embodiments, a computing device (e.g., electronic device 100, and/or some portion thereof) uses code and/or data stored on a non-transitory computer-readable storage medium to perform some or all of the operations herein described. More specifically, the computing device reads the code and/or data from the computer-readable storage medium and executes the code and/or uses the data when performing the described operations. A computer-readable storage medium can be any device, medium, or combination thereof that stores code and/or data for use by a computing device. For example, the computer-readable storage medium can include, but is not limited to, volatile memory or non-volatile memory, including flash memory, random access memory (eDRAM, RAM, SRAM, DRAM, DDR, DDR2/DDR3/DDR4 SDRAM, etc.), read-only memory (ROM), and/or magnetic or optical storage mediums (e.g., disk drives, magnetic tape, CDs, DVDs).

In some embodiments, one or more hardware modules are configured to perform the operations herein described. For example, the hardware modules can include, but are not limited to, one or more processors/cores/central processing units (CPUs), application-specific integrated circuit (ASIC) chips, field-programmable gate arrays (FPGAs), compute units, embedded processors, graphics processors (GPUs)/graphics cores, pipelines, Accelerated Processing Units (APUs), system management units, power controllers, and/or other programmable-logic devices. When such hardware modules are activated, the hardware modules perform some or all of the operations. In some embodiments, the hardware modules include one or more general purpose circuits that are configured by executing instructions (program code, firmware, etc.) to perform the operations.

In some embodiments, a data structure representative of some or all of the structures and mechanisms described herein (e.g., processing circuits 102, activation function functional block 104, and/or some portion thereof) is stored on a non-transitory computer-readable storage medium that includes a database or other data structure which can be read by a computing device and used, directly or indirectly, to fabricate hardware including the structures and mechanisms. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates/circuit elements from a synthesis library that represent the functionality of the hardware including the above-described structures and mechanisms. The netlist may then be placed and routed to produce a data set describing geometric shapes to be applied to masks. The masks may then be used in various semiconductor fabrication steps to produce a semiconductor circuit or circuits (e.g., integrated circuits) corresponding to the above-described structures and mechanisms. Alternatively, the database on the computer accessible storage medium may be the netlist (with or without the synthesis library) or the data set, as desired, or Graphic Data System (GDS) II data.

In this description, functional blocks may be referred to in describing some embodiments. Generally, functional blocks include one or more interrelated circuit elements—and possibly large numbers of circuit elements—that perform the described operations. For example, the circuit elements may include integrated circuits, discrete circuit elements, etc. In some embodiments, the circuits in a functional block include circuits that execute program code (e.g., microcode, firmware, applications, etc.) to perform the described operations. For example, a functional block may include one or more processing pipelines, compute units, processing circuits, etc. having general purpose or dedicated circuits for executing corresponding program code.

In this description, variables or unspecified values (i.e., general descriptions of values without particular instances of the values) are represented by letters such as N. As used herein, despite possibly using similar letters in different locations in this description, the variables and unspecified values in each case are not necessarily the same, i.e., there may be different variable amounts and values intended for some or all of the general variables and unspecified values. In other words, N and any other letters used to represent variables and unspecified values in this description are not necessarily related to one another.

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. Additionally, the above disclosure is not intended to limit the embodiments. The scope of the embodiments is defined by the appended claims.

What is claimed is:

1. An electronic device, comprising:
   an activation function functional block that implements an exponential linear unit (ELU) activation function, the activation functional block including:
   a set of first selection circuits and a set of second selection circuits that generate a result for the ELU activation function based on a multi-bit input value for the activation function functional block;
   wherein each of the first selection circuits generates a respective first output that is received by a respective second selection circuit to be used for generating a second output; and
   wherein the second outputs from the second selection circuits are output from the activation functional block as the result for the ELU activation function.

2. The electronic device of claim 1, wherein:
   each first selection circuit receives a respective input bit from a shifted version of the input value as a first input, a respective bit of a constant value as a second input, and a first selection bit as a selection input;

each first selection circuit outputs, as the first output, a value of the first input or the second input based on a value of the first selection bit.

3. The electronic device of claim 2, wherein:
each second selection circuit receives a first output from a respective first selection circuit as a third input, a respective bit of the input value as a fourth input, and a second selection bit as a selection input;
each second selection circuit outputs, as the second output, a value of the third input or the fourth input based on a value of the second selection bit.

4. The electronic device of claim 3, wherein a sign bit of the input value is used as the second selection bit.

5. The electronic device of claim 2, further comprising:
a selection bit generation circuit in the activation function functional block that generates the first selection bit including:
  a comparison circuit that receives, as a comparison input, a value of a specified bit of the input value and outputs, as a comparison output, a result of a comparison of the value of the specified bit with a target value; and
  a NAND gate that receives, as a first NAND input, the comparison output, and, as a second NAND input, a sign bit of the input value, and outputs as a NAND output, the first selection bit.

6. The electronic device of claim 2, further comprising:
a shifting circuit in the activation function functional block that:
  receives the input value; and
  outputs the shifted version of the input value shifted by a specified amount.

7. The electronic device of claim 2, wherein the constant value is set to a given value to be output as a result of the ELU activation function when the input value is less than −1.

8. The electronic device of claim 1, wherein the first selection circuits and the second selection circuits include some or all of: multiplexers, logic gates, transmission gates, and dynamic logic gates.

9. A method for implementing an exponential linear unit (ELU) activation function in an activation function functional block that includes a set of first selection circuits and a set of second selection circuits, the method comprising:
generating a result for the ELU activation function based on a multi-bit input value for the activation function functional block, the generating including:
  generating, by each of the first selection circuits, a respective first output;
  receiving, by a respective second selection circuit, each of the respective first outputs;
  generating, by each second selection circuit, a second output; and
  outputting the second outputs from the second selection circuits from the activation functional block as the result for the ELU activation function.

10. The method of claim 9, further comprising:
receiving, by each first selection circuit, a respective input bit from a shifted version of the input value as a first input, a respective bit of a constant value as a second input, and a first selection bit as a selection input; and
outputting, by each first selection circuit, as the first output, a value of the first input or the second input based on a value of the first selection bit.

11. The method of claim 10, further comprising:
receiving, by each second selection circuit, a first output from a respective first selection circuit as a third input, a respective bit of the input value as a fourth input, and a second selection bit as a selection input; and
outputting, by each second selection circuit, as the second output, a value of the third input or the fourth input based on a value of the second selection bit.

12. The method of claim 11, further comprising:
using, as the second selection bit, a sign bit of the input value.

13. The method of claim 10, wherein:
the activation function functional block includes a selection bit generation circuit; and
the method further comprises:
  generating the first selection bit in the selection bit generation circuit by:
    generating a comparison output based on an outcome of comparing a value of a specified bit of the input value with a target value; and
    outputting, as the first selection bit, a result output from a NAND logic gate for which inputs are the comparison output and a sign bit of the input value.

14. The method of claim 10, wherein:
the activation function functional block includes a shifting circuit; and
the method further comprises:
  receiving, by the shifting circuit, the input value; and
  outputting, by the shifting circuit, the shifted version of the input value shifted by a specified amount.

15. The method of claim 10, wherein the constant value is set to a given value to be output as a result of the ELU activation function when the input value is less than −1.

16. The method of claim 9, wherein the first selection circuits and the second selection circuits include some or all of: multiplexers, logic gates, transmission gates, and dynamic logic gates.

* * * * *